United States Patent
Okita et al.

(10) Patent No.: US 10,297,487 B2
(45) Date of Patent: May 21, 2019

(54) ELEMENT CHIP MANUFACTURING METHOD

(71) Applicant: Panasonic Intellectual Property Management Co., Ltd., Osaka (JP)

(72) Inventors: Shogo Okita, Hyogo (JP); Atsushi Harikai, Osaka (JP); Noriyuki Matsubara, Osaka (JP); Akihiro Itou, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/822,568

(22) Filed: Nov. 27, 2017

(65) Prior Publication Data

US 2018/0158713 A1 Jun. 7, 2018

(30) Foreign Application Priority Data

Dec. 6, 2016 (JP) .................. 2016-236922

(51) Int. Cl.
*H01L 21/683* (2006.01)
*H01L 21/311* (2006.01)
(Continued)

(52) U.S. Cl.
CPC .......... *H01L 21/6836* (2013.01); *H01J 37/00* (2013.01); *H01L 21/304* (2013.01); *H01L 21/31138* (2013.01); *H01L 21/78* (2013.01); *H01L 24/95* (2013.01); *H01L 21/67069* (2013.01); *H01L 21/67109* (2013.01); *H01L 24/13* (2013.01); *H01L 2221/6834* (2013.01); *H01L 2221/68336* (2013.01); *H01L 2224/95001* (2013.01)

(58) Field of Classification Search
CPC ... H01L 21/6836; H01L 24/95; H01L 21/304; H01L 21/78; H01L 21/31138
See application file for complete search history.

(56) References Cited

U.S. PATENT DOCUMENTS

| 7,767,551 | B2 * | 8/2010 | Arita ................. H01L 21/78 438/460 |
| 2004/0180473 | A1 | 9/2004 | Kawai |

(Continued)

FOREIGN PATENT DOCUMENTS

| JP | 2004-273895 A | 9/2004 |
| JP | 2008-193034 A | 8/2008 |
| JP | 2014-120494 A | 6/2014 |

*Primary Examiner* — Bilkis Jahan
*Assistant Examiner* — Victor V Barzykin
(74) *Attorney, Agent, or Firm* — Pearne & Gordon LLP (57) ABSTRACT

Provided is a method of manufacturing a semiconductor chip, the method comprising: preparing a plurality of semiconductor chips, each of which has a surface to which a BG tape is stuck, and a rear surface to which a DAF is stuck, and which are held spaced from each other by the BG tape and the DAF, exposing the DAF between semiconductor chips that are adjacent to each other when viewed from the surface side, by stripping the BG tape from the surface of each of the plurality of semiconductor chips, etching the DAF that is exposed between the semiconductor chips that are adjacent to each other, by irradiating the plurality of semiconductor chips held on the DAF, with plasma.

10 Claims, 9 Drawing Sheets

(51) Int. Cl.
  *H01L 21/78* (2006.01)
  *H01L 21/304* (2006.01)
  *H01L 23/00* (2006.01)
  *H01J 37/00* (2006.01)
  *H01L 21/67* (2006.01)

(56) References Cited

U.S. PATENT DOCUMENTS

| | | | |
|---|---|---|---|
| 2010/0173474 A1 | 7/2010 | Arita et al. | |
| 2011/0312157 A1* | 12/2011 | Lei | H01L 21/78 438/462 |
| 2012/0142165 A1* | 6/2012 | Huang | H01L 21/561 438/462 |

* cited by examiner

ELEMENT CHIP MANUFACTURING METHOD

BACKGROUND

1. Technical Field

The present disclosure relates to an element chip manufacturing method.

2. Description of the Related Art

There are various types of methods of manufacturing an element chip like a semiconductor chip. For example, a method of singulating one substrate and manufacturing a plurality of element chips is known. The element chips that result from the singulating are bonded to wiring frames, respectively. For the bonding, an adhesive film that is called a die attachment film (DAF) is used.

The DAF is stuck to a substrate before the singulating into the element chips is performed, and thus holds a substrate. Thereafter, the substrate is diced into element chips in a state of being held on the DAF, and the DAF holds a plurality of element chips that are formed by the singulating. When an individual element chip is bonded to a wiring frame, the DAF is used as a bonding material. The DAF has a property of being heated and thus being hardened. The heating and hardening of the DAF cause the element chip to be bonded to the wiring frame. For this reason, the DAF needs to be divided for every individual element chip before the element is bonded to the wiring frame. For the division of the DAF, for example, an expanding method is used in which a die dicing tape that is expandable is stuck in advance to a surface that is opposite in direction to the element chip on the DAF, a tensile force is mechanically applied to the DAF by pulling the die dicing tape, and the DAF is divided by expanding the DAF excessively (refer to Japanese Patent Unexamined Publication No. 2004-273895).

SUMMARY

According to an aspect of the present disclosure, there is provided a method of manufacturing an element chip according to the present disclosure includes preparing a plurality of element chips, each of the plurality of element chips having a first surface to which a protective tape is stuck and a second surface to which a die attachment film is stuck, wherein the plurality of element chips are held spaced from each other by the protective tape and the die attachment film, exposing the die attachment film between element chips that are adjacent to each other when viewed from the first surface side, by stripping the protective tape from the first surface of each of the plurality of element chips, etching the die attachment film that is exposed between the element chips that are adjacent to each other, by irradiating the plurality of element chips held on the die attachment film, with plasma.

According to the present disclosure, because a die attachment film is divided by etching, high-precision division of the die attachment film is possible in a method of manufacturing an element chip.

DETAILED DESCRIPTION

Problems in the related art are briefly described before describing an embodiment.

As disclosed in Japanese Patent Unexamined Publication No. 2004-273895, in a case where a DAF is divided with an expanding method, because the DAF goes into a state where it is torn into pieces, there is a concern that a portion of the DAF, which is not intended to be divided, will be divided. Moreover, there is a concern that an element chip will be damaged.

An object of the present disclosure is to make it possible to divide the die attachment film with high precision when using a method of manufacturing an element chip.

The embodiment of the present disclosure will be described below with reference to the accompanying drawings.

Figure 1A:
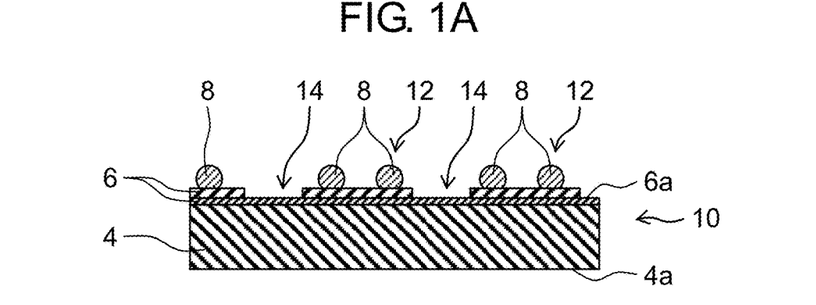
FIG. 1A is the first process diagram of a method of manufacturing an element chip according to an embodiment of the present disclosure.
Figure 1B:
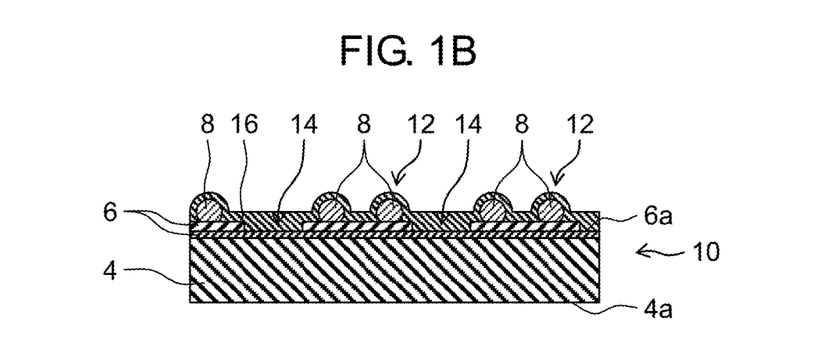
FIG. 1B is the second process diagram of the method of manufacturing an element chip according to the embodiment of the present disclosure.
Figure 1C:
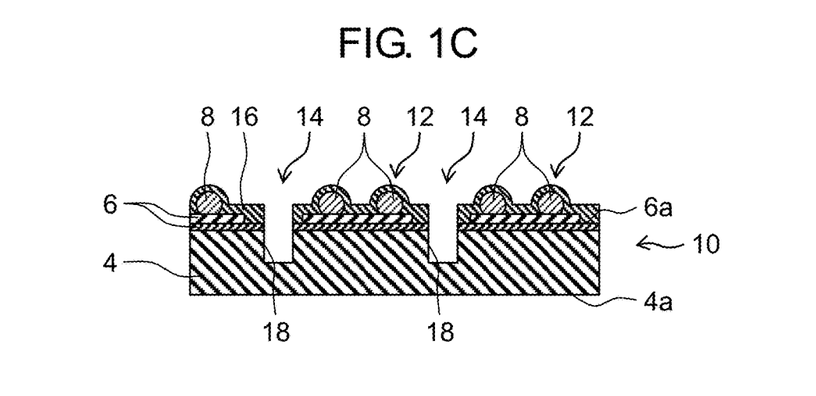
FIG. 1C is the third process diagram of the method of manufacturing an element chip according to the embodiment of the present disclosure.
Figure 1D:
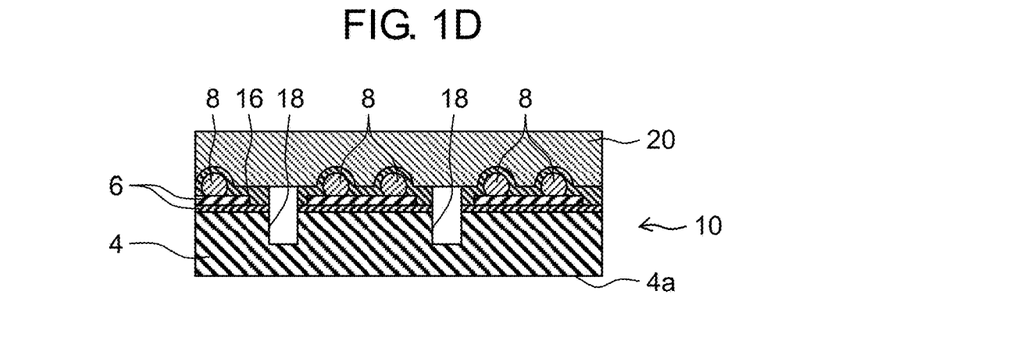
FIG. 1D is the fourth process diagram of the method of manufacturing an element chip according to the embodiment of the present disclosure.
Figure 1E:
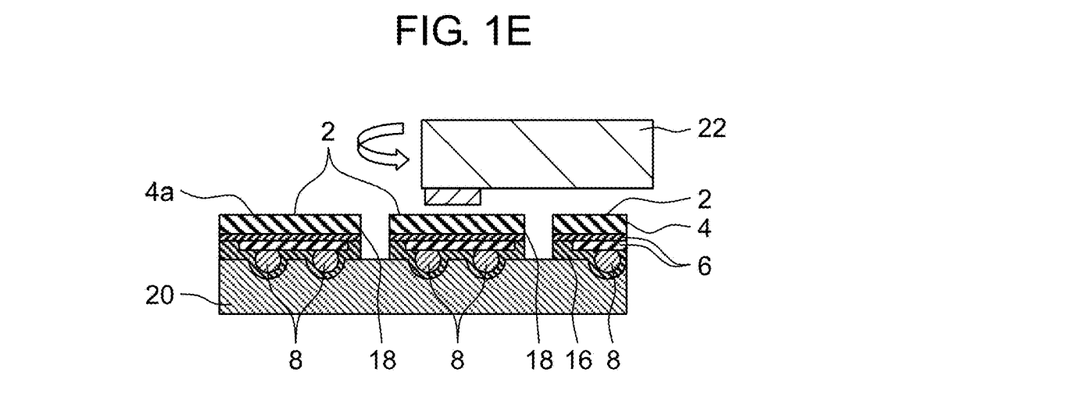
FIG. 1E is the fifth process diagram of the method of manufacturing an element chip according to the embodiment of the present disclosure.
Figure 1F:
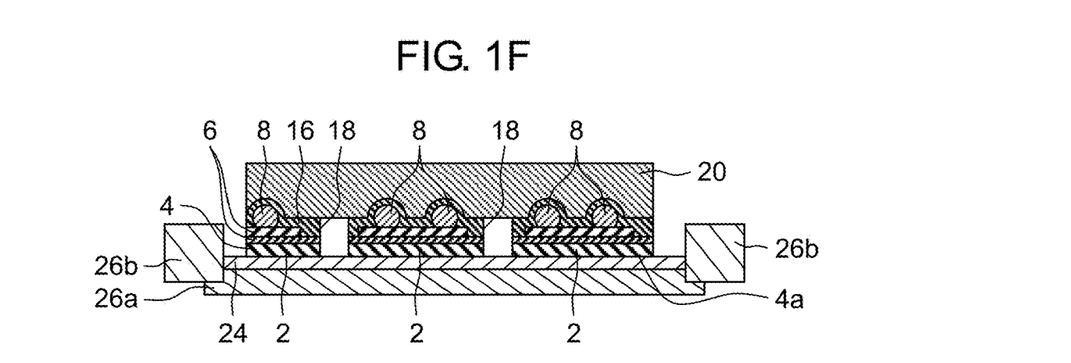
FIG. 1F is the sixth process diagram of the method of manufacturing an element chip according to the embodiment of the present disclosure.
Figure 1G:
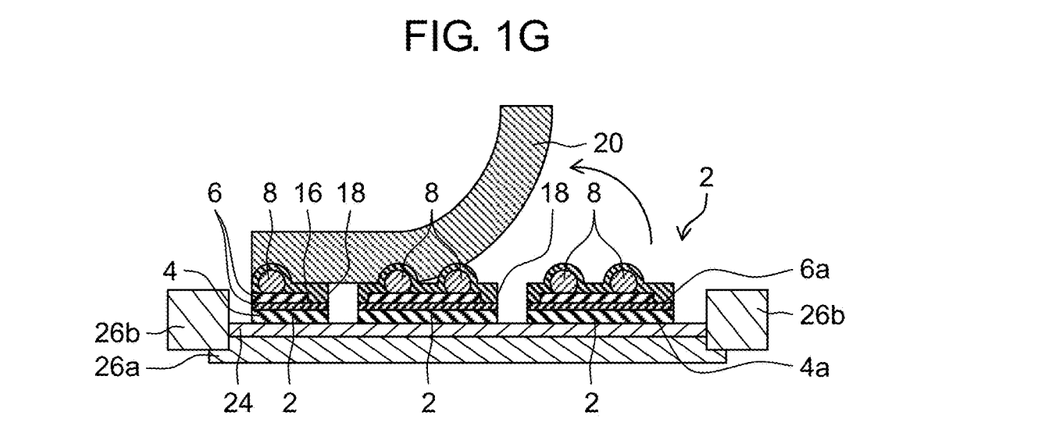
FIG. 1G is the seventh process diagram of the method of manufacturing an element chip according to the embodiment of the present disclosure.
Figure 1H:
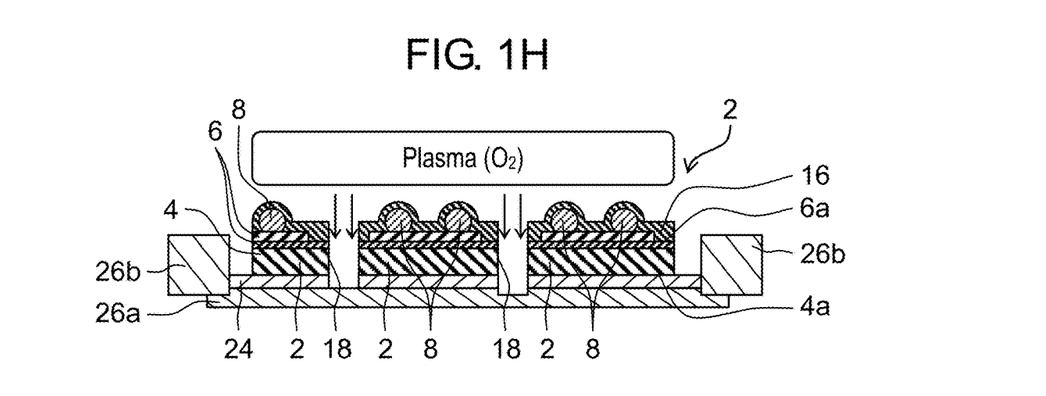
FIG. 1H is the eighth process diagram of the method of manufacturing an element chip according to the embodiment of the present disclosure.
Figure 1I:
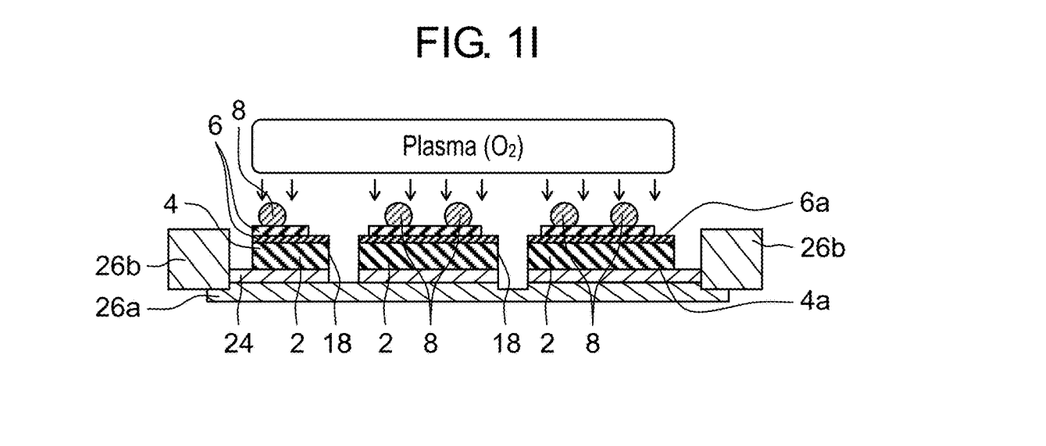
FIG. 1I is the ninth process diagram of the method of manufacturing an element chip according to the embodiment of the present disclosure.

FIGS. 1A to 1I illustrate a process of manufacturing semiconductor chip (element chip) 2 according to the embodiment of the present disclosure. With reference to FIG. 1I, semiconductor chip 2 that is manufactured includes semiconductor layer 4, wiring layer 6 that is formed on semiconductor layer 4, and bump 8 that is an electrode which is formed on wiring layer 6. An electrode that is formed on wiring layer 6 is not limited to bump 8, and may be an electrode pad that is made of Al, Cu, or the like. In the present embodiment, semiconductor layer 4 is made of Si or a Si-based material, and wiring layer 6 is made from an insulating film that is made of a material such as $SiO_2$ and a metal that is made of a material such as Cu. However, materials of semiconductor layer 4 and wiring layer 6 are not limited to these materials. For example, a material of the insulating film of wiring layer 6 may be SiN, SiOC, a Low-k (low dielectric constant) material, polybenzoxazole (PBO), polyimide, or the like. For example, a material of the metal of wiring layer 6 may include Al, an Al alloy, or W, or the like. The metal that is included in bump 8 is not particularly limited, and, for example, may be copper, an alloy of copper, tin, and silver, an alloy of silver and tin, an alloy of lead and tin, gold, aluminum, an aluminum alloy, or the like. Bump 8 is not particularly limited in shape, and may be in the shape of a square pillar, a pillar, a mountain, ball or the like. Bump 8, for example, is 20 to 200 μm in height. An arrangement of and the number of bumps 8 are not particularly, limited, and are suitably set according to its purpose.

In the first process (a substrate preparation process) that is illustrated in FIG. 1A, semiconductor wafer (substrate) 10 is prepared. Semiconductor wafer 10 is to be diced into individual semiconductor chips 2. Because of this, in the same manner as semiconductor chip 2, semiconductor wafer 10 includes semiconductor layer 4, wiring layer 6 that is formed on semiconductor layer 4, and bump 8 that is an electrode which is formed on wiring layer 6. Semiconductor wafer 10 includes a plurality of element regions 12, on each of which bump 8 is formed, and dividing region 14 that is provided between element regions 12, which is positioned in the close vicinity of each of element regions 12. In other words, discrete element regions 12 are demarcated by dividing regions 14.

In the second process (a mask coating process) that is illustrated in FIG. 1B, mask 16 is formed on surface 6a of semiconductor wafer 10. As mask 16, resist (for example, positive resist OFPR-800 manufactured by TOKYO OHKA KOGYO CO., LTD or positive resist GXR-601 manufactured by AZ) for semiconductor, resist (for example, PMER-LA900 manufactured by TOKYO OHKA KOGYO CO., LTD) for bump plating, or soluble resist may be used. In addition to resist coating, a tape or a film may be stuck. A tape, which is made from two layers, a base layer and an adhesive layer, may be stuck to surface 6a of semiconductor wafer 10, and thereafter the base layer may be stripped and only the adhesive layer may remain, as mask 16, on surface 6a of semiconductor wafer 10. Thus, mask 16 with a desired thickness (for example, 5 to 30 μm) may be formed. A method of coating mask 16 is not particularly limited, and for example, a chemical vapor deposition (CVD) method, a plasma CVD, or a sputtering method may be used.

The third process (a half cutting process) that is illustrated in FIG. 1C, groove portion 18 is formed in dividing region 14. Groove portion 18 is formed by cutting off one portion of semiconductor layer 4, wiring layer 6 and mask 16 using laser scribing or mechanical dicing, or the like. Semiconductor layer 4 is exposed to view in groove portion 18 when viewed from surface 6a of semiconductor wafer 10. In this manner, wiring layer 6 is cut off before the fifth process (singulating processing) that will be described below, and thus warping of semiconductor wafer 10 due to stress in the fifth process can be reduced. Because surface 6a is covered by mask 16 at the time of the half cutting process, cut-off scraps that occur at the time of the half cutting process, or powder dust or debris that results from the laser scribing is attached to mask 16, and thus a foreign substance can be prevented from being attached to a device.

In the fourth process (a protection process) that is illustrated in FIG. 1D, back-grinding (BG) tape (protective tape) 20 is stuck to a surface of mask 16. When rear surface 4a of semiconductor wafer 10 in a fifth process that will be described below is ground, BG tape 20 plays a role of protecting semiconductor wafer 10. When BG tape 20 is stripped, because mask 16 can be prevented from being stripped, it is preferable that BG tape 20 has a property of experiencing a decrease in an adhesive force when exposed to ultraviolet light.

In the fifth process (the singulating process) that is illustrated in FIG. 1E, semiconductor layer 4 is ground by grinding apparatus 22, starting from the rear surface (second surface) 4a side of semiconductor wafer 10. Semiconductor wafer 10 is ground until groove portion 18 is exposed, starting from the rear surface 4a side, and thus is thinned to a predetermined thickness and along with this, is sliced into a plurality of individual semiconductor chips 2.

In the sixth process (a holding process) that is illustrated in FIG. 1F, DAF 24 is stuck to rear surfaces 4a of a plurality of semiconductor chips 2 to which BG tape 20 is stuck, and along with this, a surface of semiconductor chip 2, which is opposite in direction to a surface of semiconductor chip 2 to which DAF 24 is stuck, is stuck to dicing tape (holding tape) 26a. Frame 26b is installed around dicing tape 26a from the perspective of the ease with which dicing tape 26a is handled. When it comes to the sticking of DAF 24 and dicing tape 26a, sticking of DAF 24 to semiconductor chip 2 may be performed after sticking of DAF 24 to semiconductor chip 2, and a DAF-integrated type dicing tape that results from in advance sticking DAF 24 to a sticking surface of dicing tape 26a may be stuck to semiconductor chip 2.

In the seventh process (a stripping processing) that is illustrated in FIG. 1G, BG tape 20 is stripped from semiconductor chip 2 after the sticking of dicing tape 26a. In a stripped state, DAF 24 is exposed to view in groove portion 18 between semiconductor chips 2 when viewed from surface 6a of semiconductor chip 2.

In the eighth process (an etching processing) that is illustrated in FIG. 1H, DAF 24 is etched with plasma processing.

Figure 2A:
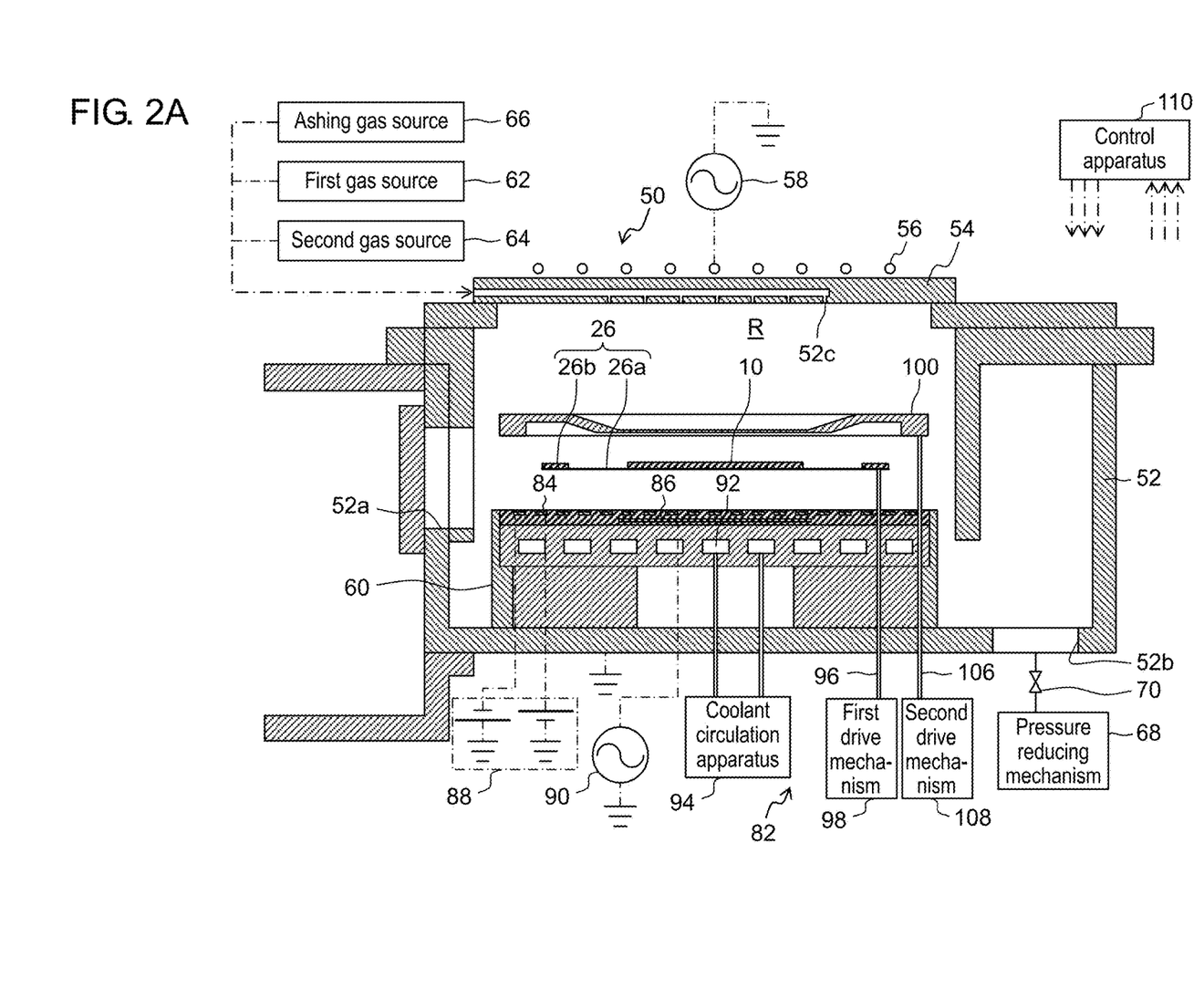
FIG. 2A is a schematic cross-sectional diagram of an etching apparatus according to the embodiment of the present disclosure.

FIG. 2A illustrates etching apparatus 50 that is an example of a plasma processing apparatus which is used in the eighth process (the etching process) and the ninth process (an ashing process). That is, using etching apparatus 50, DAF 24 is cut off with the etching in the eighth process, and ashing is performed in the ninth process.

Etching apparatus 50 includes chamber 52 that demarcates a reaction room R in which pressure is controllable. In chamber 52, transport carrier 26 is stored in the reaction room R through entrance door 52a. At this point, transport carrier 26 is made from dicing tape 26a and frame 26b, which are described.

As illustrated in FIG. 2A, an inductive coupled plasma (ICP) coil (induction coil) 56 is positioned, as an upper electrode, to be over dielectric wall 54 that closes a top of chamber 52 of etching apparatus 50. ICP coil 56 is electrically connected to first high frequency power source unit 58. On the other hand, a stage 60 on which transport carrier 26 that holds semiconductor wafer 10, as described above, is loaded, is positioned on the bottom side within chamber 52. First gas source (first gas supply mechanism) 62, second gas source (second gas supply mechanism) 64, and ashing gas source 66 are fluidly connected to gas introduction inlet 52c of chamber 52, and pressure reducing mechanism 68 that includes a vacuum pump for exhausting air within chamber 52 in a vacuum is connected to exhaust outlet 52b through a pressure adjustment valve 70.

Figure 2B:
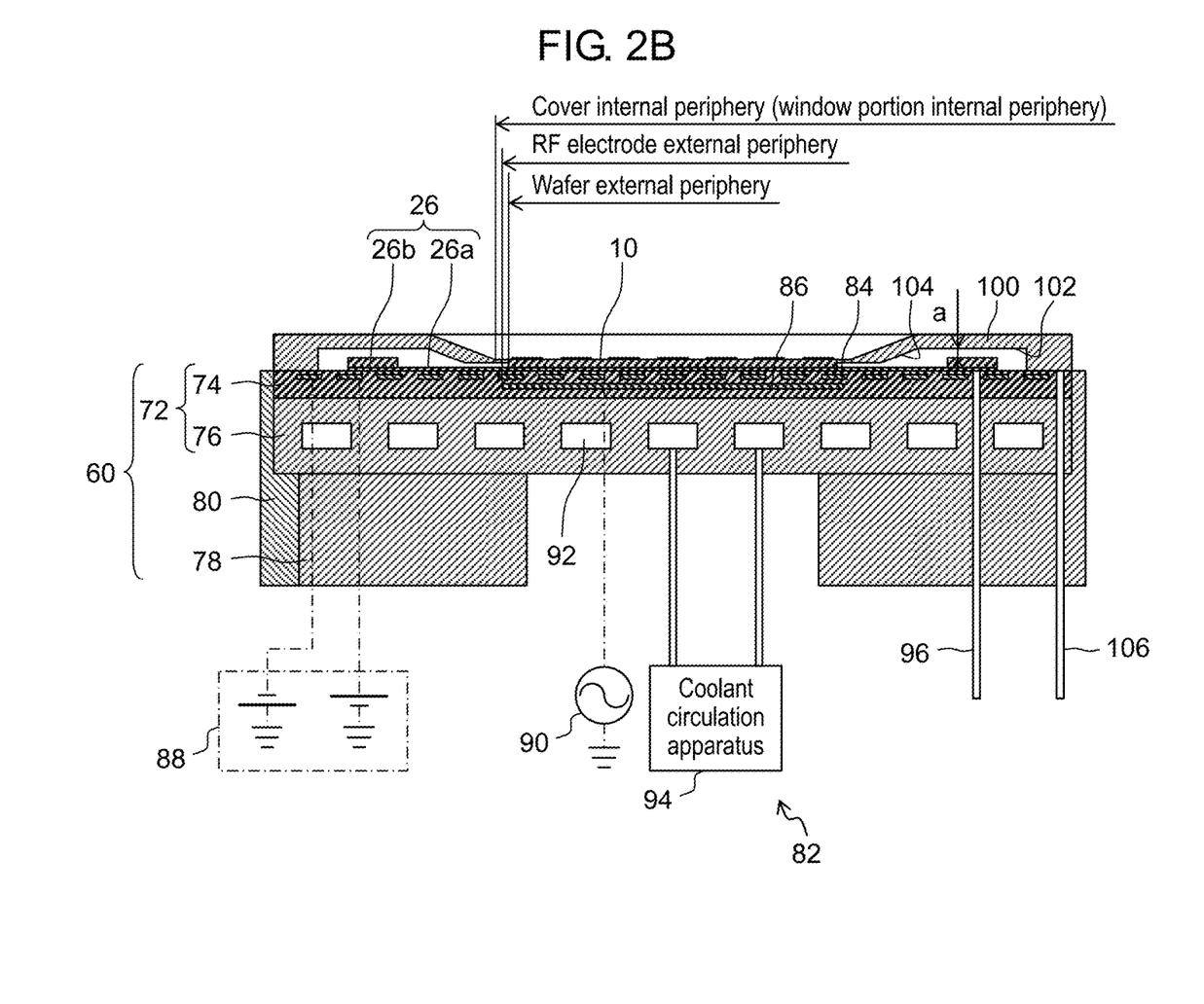
FIG. 2B is a partially enlarged diagram of FIG. 2A.

As illustrated in FIG. 2B, stage 60 includes electrode portion 72 that is made from electrostatic chuck 74 and electrode portion main body 76 which is positioned beneath electrostatic chuck 74, base portion 78 that is positioned beneath electrode portion main body 76, and exterior portion 80 that surrounds the periphery of each of these. Cooling apparatus 82 is provided on stage 60.

electrostatic chuck 74 of electrode portion 72 is configured with thin ceramics, thermally sprayed ceramics, or a sheet that is made of dielectric material. Transport carrier 26 that holds semiconductor wafer 10 is loaded on the center portion of the upper surface of electrostatic chuck 74. Cover 100 that will be described below is loaded on the periphery-side portion of electrostatic chuck 74. Electrostatic chuck electrode 84 that is of a bipolar type or of a monopolar type is built into the upper side of electrostatic chuck 74, RF electrode 86 that is of a monopolar type is built into the lower side thereof. Electric current power source 88 is electrically connected to electrostatic chuck electrode 84. Electrostatic chuck electrode 84 is positioned to extend over an entire region from the center portion of transport carrier 26 to the periphery side lower surface of cover 100, or to extend up to at least the lower side of frame 26b. Accordingly, frame 26b and cover 100, or at least frame 26b can be attached using static electricity. Second high frequency power source unit 90 is electrically connected to RF electrode 86. An external peripheral portion of RF electrode 86 is positioned on the inner periphery side of an inner peripheral edge of cover 100 that will be described below, closer to the periphery side than semiconductor wafer 10 that is loaded on transport carrier 26 when viewed from above. Accordingly, entire semiconductor wafer 10 can be etched with plasma that is caused to occur, and along with this, a source region cannot affect cover 100 and damage due to heat can be reduced.

Electrode portion main body 76 of electrode portion 72 is configured with a metal (for example, an aluminum alloy). Refrigerant passage 92 is formed on electrode portion main body 76. Electrode portion main body 76 serves as a cooling portion.

Cooling apparatus 82 is configured with refrigerant passage 92 that is formed on electrode portion main body 76, and coolant circulation apparatus 94. Coolant circulation apparatus 94 causes temperature-adjusted coolant to circulate along refrigerant passage 92, and maintains electrode portion main body 76 to a desired temperature. In cooling apparatus 82 according to the present invention, cooling of stage 60, more precisely, cooling of both transport carrier 26 and cover 100 can be performed. Accordingly, miniaturization of a plasma processing apparatus and simplification of a structure are possible.

Exterior portion 80 is made of an earth shield material (a metal that has an electrically conductive property and an etching-resistant property). With exterior portion 80, electrode portion 72, electrode portion main body 76, and base portion 78 are protected from plasma.

Transport carrier 26 is loaded on electrode portion 72 of stage 60 in a state where a sticking surface holding semiconductor wafer 10 of dicing tape 26a is positioned to be directed upward, a non-sticking surface of dicing tape 26a comes into contact with an upper surface of electrode portion 72. Transport carrier 26 is loaded in a position and a state that are determined in advance by a transport mechanism, which is not illustrated, with respect to electrode portion 72. The position and the state that are determined in advance will be described below as a normal position.

Transport carrier 26 that is loaded to be in the normal position is unloaded, in a state of being lifted up, by first drive rod 96. First drive rod 96 is driven, by first drive mechanism 98 that is conceptually illustrated only in FIG. 2A, to be raised and lowered. Specifically, transport carrier 26 can be caused to move to a raising position that is illustrated in FIG. 2A and a lowering position that is illustrated in FIG. 2B.

Cover 100 that is raised and lowered on the upper side of stage 60 is accommodated into the reaction room R within chamber 52. Cover 100 results from forming a metal material, such as an aluminum or an aluminum alloy, or a ceramic material that has excellent thermal conductivity, such as silicon carbide or aluminum nitride, into a toroidal shape with a fixed small thickness, of which an external contour is circular and which has a window portion 32 on the inner diameter side thereof.

An external diameter dimension of cover 100 is such that it is formed in a sufficiently larger size than a contour of an external shape of transport carrier 26. This is done to cover dicing tape 26a and frame 26b of transport carrier 26 for protection from plasma during the plasma processing.

A lower surface of cover 100 is caused to come into contact with a peripheral portion of stage 60. Therefore, heat of cover 100 is easy to give off to stage 60, and it is possible that cover 100 is efficiently cooled. The lower surface of cover 100 is caused to come into contact with stage 60, and thermal damage to transport carrier 26 can be effectively prevented.

An upper surface of cover 100 is made from quartz, alumina, aluminum nitride, aluminum fluoride, silicon carbide, silicon nitride, or a material that has the low reactivity with plasma, such as anodized aluminum that results from processing a surface of an aluminum material. Which material to select may be determined considering a relationship with process gas that is used. A conductive layer for increasing an attachment force due to static electricity (for example, by sticking a conductive sheet) may be formed a lower surface of cover 100 (a portion that comes into contact with electrode portion 72 that will be described below).

An external diameter dimension of RF electrode 86 is the same as or greater than an external diameter dimension of semiconductor wafer 10. The external diameter dimension of RF electrode 86 has an advantage that the greater the external diameter dimension is, the more uniform an etching rate is, but has a problem that because a source region of plasma that occurs when the external diameter dimension is too large affects cover 100, the number of ions that collide with cover 100 increases and cover 100 is heated more violently. Therefore, whether or not the diameter dimension of RF electrode 86 is suitably designed is important in making an attempt to accomplish the uniformity of the etching rate and to prevent excessive heating of cover 100 (to prevent excessive heating that causes high temperature). In the present embodiment, formation is performed in such a manner that the largest external diameter is the external diameter dimension of cover 100, the second largest external diameter is the external diameter dimension of RF electrode 86, and the third largest external diameter is the external diameter dimension of semiconductor wafer 10. Thus, the uniformity of the etching and the prevention of the excessive heating of cover 100 are compatible with each other.

Operations of raising and lowering cover 100 are performed by second drive rod 106. Cover 100 and second drive rod 106 are fixed with screws and the like that are made from a material that has excellent thermal conductivity. In a case where cover 100 is heated, the heat thereof is dissipated through second drive rod 106. Second drive rod 106 is driven by second drive mechanism 108 that is conceptually illustrated in FIG. 2A, to be raised and lowered. Cover 100 is raised and lowered by second drive rod 106 being raised and lowered. Specifically, it is possible that cover 100 moves between the raising position that is illustrated in FIG. 2A and the lowering position that is illustrated in FIG. 2B. At the lowering position, a lower surface of cover 100 comes into contact with the upper surface of electrode portion 72 of stage 60. In this manner, second drive mechanism 108 functions as a raising and lowering means that raises and lowers cover 100 with respect to stage 60, and along with this, functions as an attaching and detaching means that causes cover 100 to come into contact to an upper surface (the upper surface of electrode portion 72) of stage 60. Second drive rod 106 may move in a state of linking up with first drive rod 96, and one drive mechanism may be performed.

As illustrated in FIG. 2A, cover 100 at the raising position is at a position that is sufficiently apart from the top of stage 60. Therefore, it is possible that if cover 100 is at the raising position, an operation of causing transport carrier 26 to be loaded on the upper surface of electrode portion 72, and an operation of lowering transport carrier 26 from the upper surface of electrode portion 72 are performed.

As illustrated in FIG. 2B, cover 100 at lowering position covers one portion of dicing tape 26a and frame 26b of transport carrier 26 that is at the normal position. The periphery side lower surface of cover 100 comes into contact with the upper surface of electrode portion 72 and is attached by electrostatic chuck electrode 84 using static electricity. Alternatively, the periphery side lower surface of cover 100 is pressed by second drive rod 106 against stage 60, thereby coming into contact with stage 60. In this state, it is possible that the heat of cover 100 dissipates from electrode portion 72, base portion 78, and exterior portion 80 to the outside through chamber 52.

Transport carrier 26 is covered with cover 100, and thus transport carrier 26 is protected from plasma. Because ceiling surface 102 of cover 100 is positioned a sufficient gap a (for example, 1 to 5 mm) apart from frame 26b, transport carrier 26 is difficult to influence at the time of the plasma processing. Inclined surface 104 of cover 100 is positioned a sufficient distance apart from dicing tape 26a that is exposed on an internal diameter side of frame 26b. As apparent from the drawings, cover 100 at the lower position does not come into contact with any of frame 26b, dicing tape 26a, and semiconductor wafer 10. Alternatively, in order to straighten curved frame 26b, one portion (for example, 4 to 8 points) of cover 100 may press frame 26b against stage 60 through a resin material or the like that has poor thermal conductivity.

Control apparatus 110 that is schematically illustrated only in FIG. 2A controls an operation of each element that constitutes etching apparatus 50 which includes first high frequency power source unit 58, first gas source 62, second gas source 64, ashing gas source 66, pressure reducing mechanism 68, electric current power source 88, second high frequency power source unit 90, coolant circulation apparatus 94, first drive mechanism 98, and second drive mechanism 108.

In the eighth process, semiconductor wafer 10 is loaded on stage 60 through dicing tape 26a. After the loading is finished, exhausting air within chamber 52 (refer to FIG. 2A) is exhausted in a vacuum by pressure reducing mechanism 68, and along with this, for example, etching gas such as oxygen is supplied from ashing gas source 66 into chamber 52 and thus a predetermined temperature and a predetermined pressure are maintained. Thereafter, a high frequency electric power is supplied from first high frequency power source unit 58 to ICP coil 56, and plasma is caused to be generated within chamber 52 and then DAF 24 of semiconductor wafer 10 is exposed to the plasma. DAF 24 that is exposed in groove portion 18 is removed by a physicochemical reaction between a radical and an ion in the plasma.

An etching condition is set according to a material of DAF 24 that is etched, and the like. If DAF 24 is made from an organic material and a filler such as Si or $SiO_2$, plasma that includes an oxygen radical which has the high reactivity with the organic material and a fluorine radical which has the high reactivity with Si is used. Along with this, it is preferable that the ionicity of the etching is increased by applying a bias electric power to stage 60 and thus it is preferable that the etching is performed in such a manner that a residue due to the filler does not remain. Therefore, it is preferable that the etching is performed using a mixed gas that results from adding $SF_6$ or $CF_4$ to $O_2$. In addition, from the perspective of preventing side etching, it is preferable that $N_2$ is added, and that changing to $O_2$ takes place and thus setting to $CO_2$ takes place.

As will be described below, because DAF 24 is etched at a high speed without the residue, if $SF_6$ is added to $O_2$, it is preferable that a flow rate (an $SF_6$ rate) of $SF_6$ is equal to or greater than 5%. Because the ionicity of the etching and a radical nature are compatible with each other, it is preferable that a pressure is approximately 5 to 10 Pa. An ICP electric power may be a high one. When the bias electric power is increased, an etching speed is improvised, but because it is not preferable that a temperature of the DAF is increased too much, it is preferable that the bias electric power is adjusted to such a suitable electric power that a temperature of DAF 24 is not increased too much during the etching. It is preferable that the temperature of DAF 24 during the etching is equal to or lower than 50° C. Because the temperature of the DAF 24 during the etching is kept at a low temperature, it is preferable that stage 60 is cooled to a low temperature (which is equal to or lower than 15° C.).

For example, while an amount of 350 sccm of flowing oxygen and an amount of 50 sccm of flowing $SF_6$, as the etching gas, are supplied into chamber 52, a pressure within chamber 52 can be maintained to 5 to 10 Pa and a high frequency electric power of 3000 to 5000 W can be supplied to ICP coil 56. Along with this, by supplying a high frequency electric power of 500 to 1000 W to stage 60, DAF 24 can be etched at an etching speed of approximately 1.5 to 4 μm/minute.

A result of conducting a study on a condition for etching DAF 24 is illustrated FIGS. 3A to 3E. As DAF 24, two types of DAFs that have different amounts of added filler are prepared. A DAF-A is a DAF that has a small amount of added filler, and a DAF-B is a DAF that has a large amount of added filler. An ICP electric power, a bias electric power, a pressure, a temperature, a type of etching gas, and an amount of flowing etching gas are set to be parameters, and etching of the DAF-A and the DAF-B is performed under a plurality of etching conditions, and measuring of the etching speed is performed. Results of measuring the etching conditions and the etching speeds are illustrated Table 1.

TABLE 1

| Conditions | Gas flow rate (sccm) | | | Flow rate of SF$_6$ (%) | Pressure (Pa) | ICP (W) | Bias (W) | DAF etching speed (μm/min) | |
|---|---|---|---|---|---|---|---|---|---|
| | Ar | SF$_6$ | O$_2$ | | | | | DAF-A | DAF-B |
| 1 | 0 | 0 | 350 | 0.0 | 4 | 2200 | 500 | 0.95 | 0.56 |
| 2 | 0 | 25 | 350 | 6.7 | 4 | 2200 | 500 | 1.86 | 1.28 |
| 3 | 0 | 50 | 350 | 12.5 | 4 | 2200 | 500 | 1.97 | 1.21 |
| 4 | 0 | 100 | 350 | 22.2 | 4 | 2200 | 500 | 1.87 | 1.40 |
| 5 | 0 | 50 | 350 | 12.5 | 4 | 4400 | 500 | 2.15 | 1.23 |
| 6 | 0 | 50 | 350 | 12.5 | 4 | 3300 | 750 | 2.37 | 1.66 |
| 7 | 0 | 50 | 350 | 12.5 | 4 | 4400 | 750 | 2.44 | 1.73 |
| 8 | 100 | 50 | 350 | 10.0 | 4 | 4400 | 750 | 2.36 | 1.45 |
| 9 | 0 | 50 | 350 | 12.5 | 2 | 4400 | 750 | 1.89 | 1.31 |
| 10 | 0 | 50 | 350 | 12.5 | 8 | 4400 | 750 | 2.95 | 1.94 |
| 11 | 0 | 50 | 350 | 12.5 | 16 | 4400 | 750 | 2.89 | 1.78 |

Figure 3A:
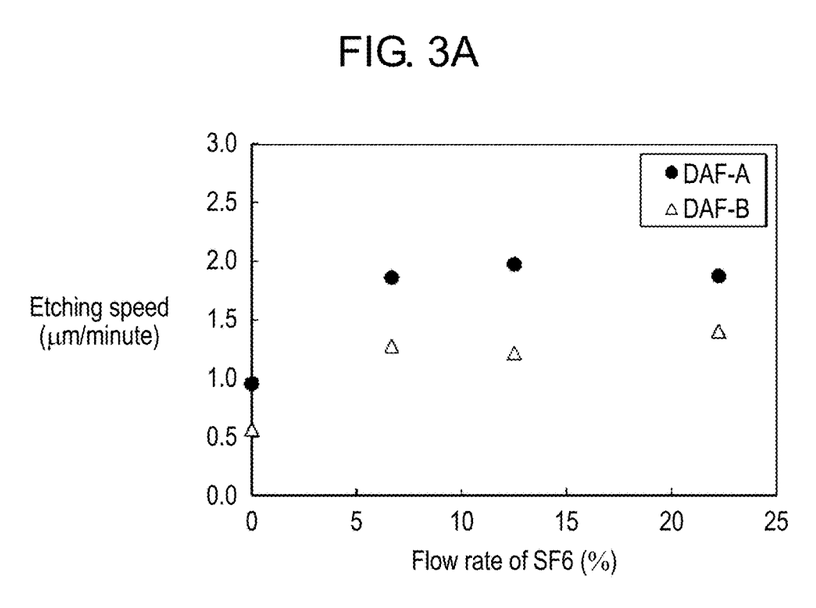
FIG. 3A is a diagram illustrating the dependence of an etching speed on a flow rate of $SF_6$.

The dependence of the etching speed on an amount of added SF$_6$ is illustrated in FIG. 3A. By adding SF$_6$ to approximately 5% or more, an etching speed of DAF 24 is etched can be increased two times in comparison with a case where SF$_6$ is not added.

Figure 3B:
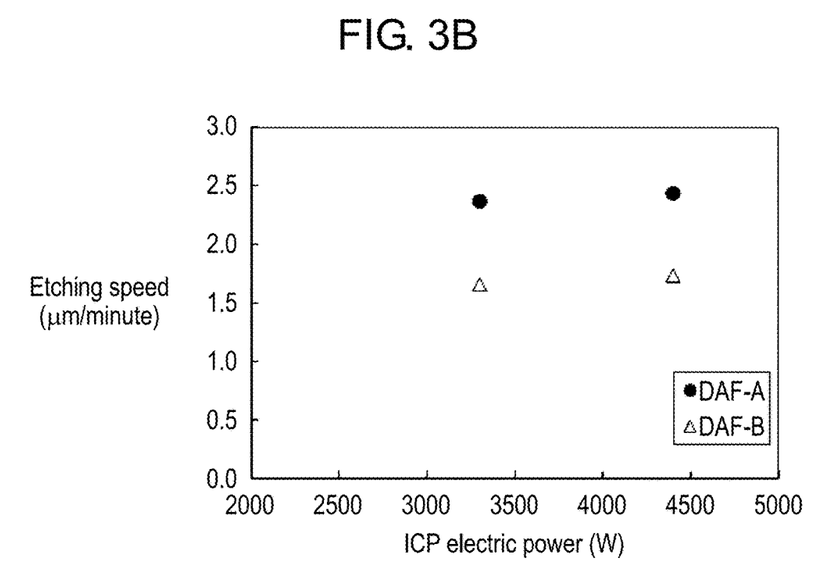
FIG. 3B is a diagram illustrating the dependence of the etching speed on an ICP electric power.

The dependence of the etching speed on the ICP electric power is illustrated in FIG. 3B. By causing the ICP electric power to be increased, the etching speed of DAF 24 can be increased.

Figure 3C:
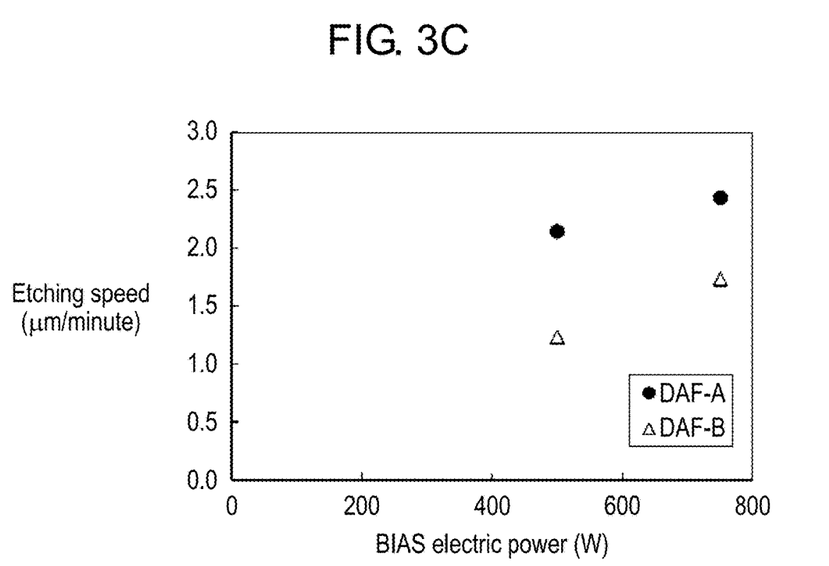
FIG. 3C is a diagram illustrating the dependence of the etching speed on a bias electric power.

The dependence of the etching speed on the bias electric power is illustrated in FIG. 3C. By causing the bias electric power to be increased, the etching speed of DAF 24 can be increased.

Figure 3D:
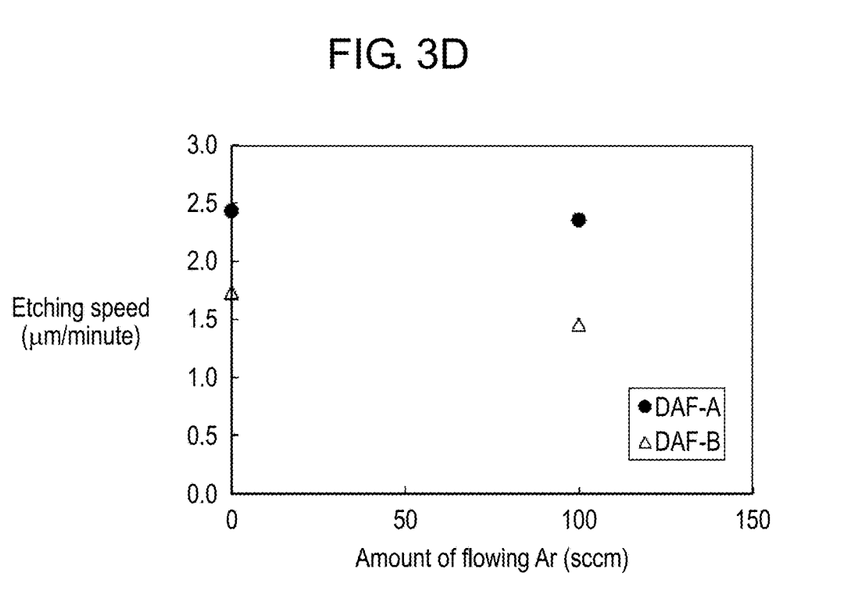
FIG. 3D is a diagram illustrating the dependence of the etching speed on an amount of flowing Ar.

The dependence of the etching speed on the amount of added argon (an amount of flowing Ar) is illustrated in FIG. 3D. By adding argon gas, the etching speed of DAF 24 is somewhat decreased.

Figure 3E:
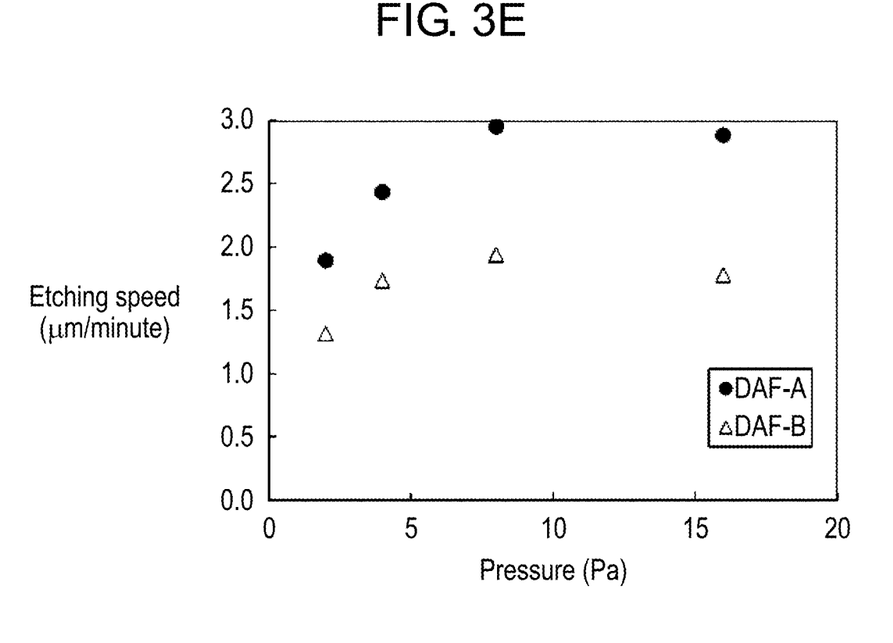
FIG. 3E is a diagram illustrating the dependence of the etching speed on a pressure.

The dependence of the etching speed on the pressure is illustrated in FIG. 3E. It is seen that the etching speed is improved in a region under a pressure of 5 to 10 Pa.

To wrap up contents in Table 1 and FIGS. 3A to 3E, in order to cause the etching speed to be improved, it is preferable that SF$_6$ is added to approximately 5% or more, that the ICP electric power is caused to be increased, that the bias electric power is caused to be increased, and that the etching is performed in a region under a pressure of 5 to 10 Pa without adding argon gas.

Figure 4A:
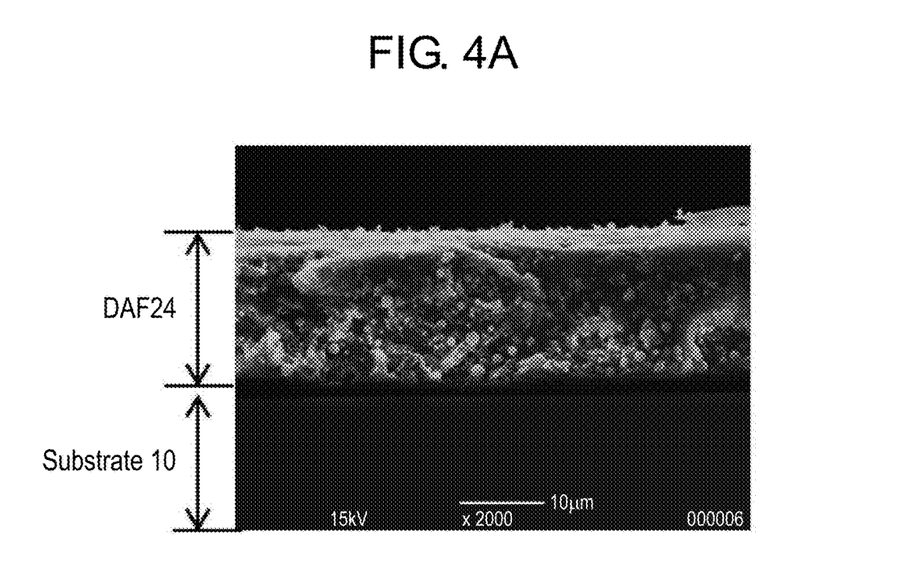
FIG. 4A is a diagram illustrating a picture of a cross section of a substrate before etching, which is taken with an electron microscope.
Figure 4B:
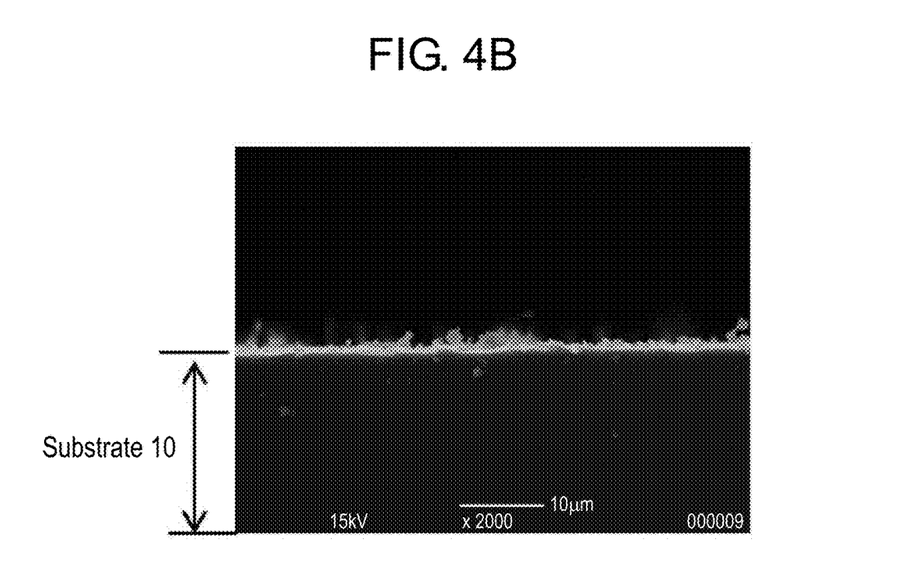
FIG. 4B is a diagram illustrating a picture of the cross section of the substrate after the etching, which is taken with the electron microscope.

FIGS. 4A and 4B are pictures of a cross section of semiconductor wafer (substrate) 10 before and after the etching, which are taken with an electron microscope. As illustrated in these figures, only DAF 24 is reliably removed by the etching in the eighth process.

In the ninth process (the ashing process) that is a final process which is illustrated in FIG. 1I, while air within chamber 52 (refer to FIG. 2A) is exhausted in a vacuum, ashing gas is supplied from ashing gas source 66 into chamber 52 and thus a predetermined temperature and a predetermined pressure are maintained. In the present process, in order to remove an organic substance that is a main component of mask 16, a main component of the ashing gas is oxygen. Indeed, because the main component of DAF 24 that is etched in the eighth process is an organic substance as well, the same etching gas of which the main component is oxygen in the eighth process and in the ninth process may be used. In a case where the same etching gas is used, as illustrated in FIGS. 1H and 1I, a process diagram is divided for illustration, but the eighth process and the ninth process proceed substantially at the same time.

In a case where the eighth and the ninth process proceed substantially at the same time, when the ashing (the ninth process) of mask 16 is completed earlier than the etching (the eighth process) of DAF 24, there is a concern that bump 8 which is uncovered will be irradiated with plasma during the etching of DAF 24 and be damaged. In order to prevent this damage, it is preferable that the thickness of mask 16 is larger than the thickness of DAF 24. Accordingly, in the eighth process and the ninth process, even in a case where mask 16 is etched at the same time when DAF 24 is etched, because mask 16 is thicker than DAF 24, mask 16 can be prevented from being removed entirely in advance. Therefore, semiconductor chip 2 can be reliably protected by mask 16 from the plasma.

It is preferable that in a condition for etching DAF 24 in the eighth process, the bias electric power is higher than in a condition for ashing mask 16 in the ninth process. In this case, the ionicity of the etching of DAF 24 in the eighth process is increased, and cut-off scraps that are attached on mask 16 at the time of the half cutting processing in the third process or power dust or debris that results from the laser scribing is easy to remove in the eighth process. That is, the etching DAF 24 in the eighth process has an effect of removing a foreign material on mask 16 and the uppermost layer of mask 16. For this reason, it is possible that mask 16 that remains after the eighth process is removed under an ashing condition in which the ionicity is weak. Consequently, in the ashing condition in the ninth process, because the damage to the device or bump 8 is controlled, the bias electric power can be set to be low (or is set to zero).

In the same manner, the condition for etching DAF 24 in the eighth process is set to be a comparatively high bias electric power, and thus mask 16 that remains after the eighth process can be easy to remove by chemical cleaning and mask 16 can be removed by the chemical cleaning that uses mask stripping solution, without performing ashing. In a case where water soluble resist is used as mask 16, mask 16 can be removed with flushing without performing the ashing.

With the first to ninth processes described above, semiconductor chip 2 is manufactured in a state of being held on dicing tape 26a. Semiconductor chip 2 is picked up from etching apparatus 50 and is sent for post-processes, but semiconductor wafer 10 (an aggregate of semiconductor chips 2) is held in dicing tape 26a with frame 26b, handling is easy in the post-process.

Advantageous effects in a case where a method of manufacturing semiconductor chip 2, which includes the first to ninth processes described above, is used, will be described.

With the method according to the present embodiment, as in the eighth process, only an exposed portion of DAF 24 is precisely etching-removed, high-precision division is possible in comparison with division that uses an expanding method. In the case of the expanding method, because the division of DAF 24 is performed using a tensile force that occurs when dicing tape 26a is pulled in the horizontal direction, the division of DAF 24 is not performed in a uniform manner due to a variation in a force that is added in the horizontal direction to individual element chip 2 which is held on DAF 24, a variation in an elongation direction of dicing tape 26a or DAF 24, a variation in a position at which the division is started in an individual division point or division line, a variation of stress that is inherent in the individual division point or division line, or the like. For this reason, a variation occurs in a direction of individual element chip 2 that is held on dicing tape 26a or a distance between element chips 2, or the like after the division of DAF 24, and an alignment nature of the element chip 2 after the singulating is poor. When the alignment nature is poor, it is difficult to cause a probe to come into contact with a suitable position at the time of performing wafer-level inspection in an inspection process. However, according to the present disclosure, it is newly found out that it is possible that DAF 24 is divided for every element chip 2 without having a bad effect on the alignment nature. Accordingly, the wafer-level inspection in the inspection process is possible. The division of DAF 24 by the plasma etching imposes less load on semiconductor chip 2 in comparison with the division of DAF 24 using the expanding method, and damage to semiconductor chip 2 can be prevented. According to the present disclosure, because DAF 24, which is exposed between element chips 2, is processed by performing the etching that uses plasma, broken pieces of DAF 24 do not occur.

As in the first to sixth processes, groove portion 18 is formed in the surface 6a side of semiconductor wafer 10 and then is ground starting from the rear surface 4a side. Thus, a plurality of semiconductor chips 2 that results from singulating one semiconductor wafer 10 can be formed using a simple method. Accordingly, the plurality of semiconductor chips 2 to which BG tape 20 and DAF 24 that are used in the seventh process are stuck can be easily prepared. The alignment nature of element chip 2 is good, and it is possible that DAF 24 is divided by a size that is the same as that of element chip 2. At the time of the division, because it is difficult for the broken pieces of DAF 24 to occur, it is possible that for element chip 2 in the post-process, the precision of position recognition or the precision of mounting is improved when picking up element chip 2 in the post-process.

With the formation of mask 16 as in the second process, DAF 24 can be etched in the eighth process, and because mask 16 protects semiconductor chip 2 from plasma, damage to the element chip can be prevented. Particularly, mask 16 is formed before forming groove portion 18 in dividing region 14, and thus damage to semiconductor chip 2 that is to occur when forming groove portion 18 can be prevented.

In addition to the present embodiment described so far, as a modification example thereof, BG tape 20 is stripped and thus DAF 24 between semiconductor chips 2 is exposed in the seventh process (refer to FIG. 1G), and then, a plurality of semiconductor chips 2 that are held in DAF 24 are irradiated with plasma and a surface of groove portion 18 that is formed in dividing region 14 may be etched. On a flank surface of groove portion 18 that is formed in the mechanical dicing or the laser scribing in the third process, a microcrack is present when performing chipping or within semiconductor layer 4, and this causes a decrease in flexural strength of semiconductor chip 2. In this case, semiconductor layer 4 is isotropically etched and thus an acute region of a flank surface of semiconductor layer 4 that is formed by the etching is rounded, an etched portion itself is removed, or a surface that includes the microcrack is removed. Thus, the improvement in flexural strength is possible. It is preferable that when it comes to the extent to which semiconductor layer 4 is etched by isotropical etching, removal is performed to the extent of approximately 0.5 to 5 μm. As a condition for isotropical etching, while an amount of 100 to 600 sccm of flowing $SF_6$ is supplied as source gas, a condition in which a pressure is adjusted to the extent of 4 to 30 Pa and an ICP electric power of approximately 2000 to 4800 W is applied can be illustrated.

According to the present embodiment, because the surface of groove portion 18 that is formed in dividing region 14, that is, a damaged layer on flank surface of the semiconductor chip 2 can be removed, the flexural strength of semiconductor chip 2 can be improved. Particularly, when groove portion 18 is formed in dividing region 14 in the third process (refer to FIG. 1C), in a case where dividing region 14 is directly cut as in the mechanical dicing, because the damaged layer such as a cutting-caused scar occurs on the surface of groove portion 18, an adverse influence is exerted from the perspective of the flexural strength. However, as in the present modification example, the damaged layer can be removed with a simple method, and thus this adverse influence can be suppressed.

The present disclosure relates to the etching of the DAF that is stuck to the element chip, but is applicable even in a case where, as a substitute for the DAF, a resin sticking material such as an adhesive material is used.

The specific embodiment and the modification example thereof in the present disclosure are described above. However, the present disclosure is not limited to the embodiment described above, and various changes can be made for implementation within the scope of the disclosure.

(Wrapping Up)

According to an aspect of the present disclosure, there is provided a method of manufacturing an element chip according to the present disclosure includes preparing a plurality of element chips, each of the plurality of element chips having a first surface to which a protective tape is stuck and a second surface to which a die attachment film is stuck, wherein the plurality of element chips are held spaced from each other by the protective tape and the die attachment film, exposing the die attachment film between element chips that are adjacent to each other when viewed from the first surface side, by stripping the protective tape from the first surface of each of the plurality of element chips, etching the die attachment film that is exposed between the element chips that are adjacent to each other, by irradiating the plurality of element chips held in the die attachment film, with plasma.

According to the method, because only the DAF on the exposed portion is precisely etching-removed, high-precision division is possible in comparison with an expanding method. In the case of the expanding method, because the division of the DAF is performed using a tensile force that occurs when the dicing tape is pulled in the horizontal direction, the division of DAF is not performed in a uniform manner due to a variation in a force that is added in the horizontal direction to an individual chip which is held in the DAF, a variation in an elongation direction of a dicing tape or the DAF, a variation in a position at which the division is started in an individual division point or division line, a variation of stress that is inherent in the individual division point or division line, or the like. For this reason, a variation occurs in a direction of an individual chip that is held on the dicing tape or a distance between element chips, or the like after the division of the DAF, and an alignment nature of the element chip after the singulating is poor. When the alignment nature is poor, it is difficult to cause a probe to come into contact with a suitable position at the time of performing wafer-level inspection in an inspection process. However, according to the present disclosure, it is newly found out that it is possible that the DAF is divided for every element chip without having a bad effect on the alignment nature. Accordingly, the wafer-level inspection in the inspection process is possible. The division of DAF that uses this method imposes less load on the element chip in comparison with the division of DAF using the expanding method, and damage to the element chip can be prevented. According to the present disclosure, because the DAF, which is exposed between the element chips, is processed by performing the etching that uses plasma, broken pieces of DAF do not occur.

The method of manufacturing an element chip may include preparing a substrate that has a first surface and a second surface that is opposite in direction to the first surface, the first surface including a plurality of element regions on which elements of the plurality of element chips are formed respectively, and dividing regions that demarcate the plurality of element regions respectively, in preparing the plurality of element chips, forming a groove portion that has a depth which does not reach the second surface, in each of the dividing regions on the first surface of the substrate, sticking the protective tape to the first surface of the substrate, singulating the substrate into the plurality of element chips by grinding the second surface of the substrate until the groove portion is exposed, in such a manner that element chips that are adjacent to each other are held spaced from each other on the protective tape, and sticking one side of the die attachment film to the second surface of the plurality of element chips that are held on the protective tape, and along with the sticking of the one side of die attachment film, sticking the other side of the die attachment film to a holding tape that is supported by a frame.

With the method, because the plurality of element chips can be formed from one substrate using a simple method, it is easy to prepare the plurality of element chips to which the protective tape and the DAF are stuck as described above. The alignment nature of the element chip is good, and it is possible that the DAF is divided by a size that is the same as that of the element chip. At the time of the division, because it is difficult for the broken pieces of the DAF to occur, it is possible that for the element chip in the post-process, the precision of position recognition or the precision of mounting is improved when picking up the element chip in the post-process.

The method of manufacturing an element chip may include exposing the die attachment film by stripping the protective tape, and then etching a surface of the groove portion that is formed in the dividing region by irradiating the plurality of element chips that are held on the die attachment film with plasma.

With the method, the surface of the groove portion that is formed in the dividing region, that is, a damaged layer on a flank surface of the element chip can be removed, and the flexuralstrength can be improved. Particularly, when the groove portion is formed in the dividing region, in a case where the dividing region is directly cut as in the mechanical dicing, because the damaged layer such as a cutting-caused scar occurs on the surface of the groove portion, an adverse influence is exerted from the perspective of the flexural strength. However, as in the configuration described above, the damaged layer can be removed with a simple method, and thus this adverse influence can be suppressed.

The method of manufacturing an element chip may include forming, on the first surface of the substrate, a mask that covers the first surface, before forming the groove portion in the dividing region.

With the method, when the die attachment film is etched, because the mask protects the element chip from the plasma, damage to the element chip can be prevented. Particularly, the mask is formed before forming the groove portion in the dividing region, and thus the damage to the element chip that is to occur when forming the groove portion can be prevented.

In the method of manufacturing an element chip, the thickness of the mask may be larger than the thickness of the die attachment film.

With the method, even in a case where the mask is etched as well when the die attachment film is etched, because the mask is thicker than the die attachment film, the mask can be prevented from being removed in advance. Therefore, because the mask reliably protects the element chip from the plasma, the element chip can be reliably protected from the plasma when etching the die attachment film.

What is claimed is:

1. An element chip manufacturing method, comprising:
preparing a plurality of element chips, each of the plurality of element chips having a first surface covered by a mask to which a protective tape is stuck via the mask and a second surface to which a die attachment film is stuck, wherein the plurality of element chips are held spaced from each other by the protective tape and the die attachment film;
exposing the die attachment film between element chips that are adjacent to each other when viewed from the first surface side, by stripping the protective tape from the first surface of each of the plurality of element chips, leaving the mask on the first surface of each of the plurality of element chips; and
etching the die attachment film that is exposed between the element chips that are adjacent to each other, by irradiating the plurality of element chips held on the die attachment film, with plasma, while the first surface of each of the plurality of element chips are covered by the mask.

2. The element chip manufacturing method of claim 1, wherein the preparing of the plurality of element chips includes
preparing a substrate that has a first surface and a second surface that is opposite in direction to the first surface, the first surface including a plurality of element regions on which elements of the plurality of element chips are formed respectively, and dividing regions that demarcate the plurality of element regions respectively,
forming the mask that covers the first surface,
forming a groove portion that has a depth which does not reach the second surface, in each of the dividing regions on the first surface of the substrate,
sticking the protective tape to the first surface of the substrate, singulating the substrate into the plurality of element chips by grinding the second surface of the substrate until the groove portion is exposed, in such a manner that element chips that are adjacent to each other are held spaced from each other on the protective tape, and sticking one side of the die attachment film to the second surface of the plurality of element chips that are held on the protective tape, and along with the sticking of the one side of the die attachment film, sticking the other side of the die attachment film to a holding tape that is supported by a frame.

3. The element chip manufacturing method of claim 2, wherein after exposing the die attachment film by stripping the protective tape, etching of a surface of the groove portion that is formed in the dividing region is performed by irradiating the plurality of element chips that are held on the die attachment film with plasma.

4. The element chip manufacturing method of claim 1, wherein the thickness of the mask is larger than the thickness of the die attachment film.

5. The element chip manufacturing method of claim 2, wherein etching of a surface of a sidewall of element chips is performed after exposing of the die attachment film and before etching of the die attachment film.

6. The element chip manufacturing method of claim 5, wherein the forming of the groove is performed by mechanical dicing.

7. The element chip manufacturing method of claim 5, wherein the forming of the groove is performed by laser scribing.

8. The element chip manufacturing method of claim 5, wherein the surface of the sidewall of element chips is removed to an extent of 0.5 to 5 um during the etching of the surface of the sidewall of element chips.

9. The element chip manufacturing method of claim 2, wherein the singulating of the substrate by grinding is performed without filling the groove portion.

10. The element chip manufacturing method of claim 1, wherein the die attachment film which is supported by a dicing tape is stuck to the second surface in the preparing of the plurality of element chips, and the etching of the die attachment film is performed until the dicing tape between the element chips that are adjacent to each other is exposed.

* * * * *